United States Patent
Inoue et al.

(10) Patent No.: US 9,559,127 B2
(45) Date of Patent: Jan. 31, 2017

(54) THIN FILM TRANSISTOR ARRAY PANEL

(71) Applicant: Samsung Display Co., Ltd., Yongin, Gyeonggi-Do (KR)

(72) Inventors: Daisuke Inoue, Cheonan-si (KR); Mi Suk Kim, Cheonan-si (KR); Si Heun Kim, Hwaseong-si (KR); Tae Ho Kim, Asan-si (KR); So Youn Park, Hwaseong-si (KR); Keun Chan Oh, Cheonan-si (KR); Chang-Hun Lee, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 14/585,336

(22) Filed: Dec. 30, 2014

(65) Prior Publication Data
US 2015/0187811 A1    Jul. 2, 2015

(30) Foreign Application Priority Data
Dec. 31, 2013    (KR) .......................... 10-2013-0169354

(51) Int. Cl.
| | | |
|---|---|---|
| *H01L 27/14* | (2006.01) | |
| *H01L 29/04* | (2006.01) | |
| *H01L 29/15* | (2006.01) | |
| *H01L 31/036* | (2006.01) | |
| *H01L 27/12* | (2006.01) | |
| *H01L 29/49* | (2006.01) | |
| *H01L 29/51* | (2006.01) | |
| *H01L 29/417* | (2006.01) | |
| *G02F 1/1365* | (2006.01) | |
| *G02F 1/1333* | (2006.01) | |

(52) U.S. Cl.
CPC ........... *H01L 27/124* (2013.01); *G02F 1/1365* (2013.01); *G02F 1/133345* (2013.01); *H01L 29/41733* (2013.01); *H01L 29/4908* (2013.01); *H01L 29/517* (2013.01)

(58) Field of Classification Search
None
See application file for complete search history.

(56) References Cited

U.S. PATENT DOCUMENTS

| | | | |
|---|---|---|---|
| 2007/0235805 A1 | 10/2007 | Yan | |
| 2009/0047759 A1* | 2/2009 | Yamazaki | H01L 29/04 438/158 |
| 2010/0176393 A1* | 7/2010 | Kim | H01L 29/7869 257/43 |

(Continued)

FOREIGN PATENT DOCUMENTS

| | | |
|---|---|---|
| JP | 2012-118199 A | 6/2012 |
| KR | 10-0436011 B1 | 6/2004 |

(Continued)

*Primary Examiner* — Calvin Choi
(74) *Attorney, Agent, or Firm* — Cantor Colburn LLP

(57) ABSTRACT

A thin film transistor array panel includes an insulation substrate; a gate line and a first electrode on the insulation substrate; a gate insulating layer on the gate line and the first electrode; a data line on the gate insulating layer; a passivation layer on the gate insulating layer and the data line; and a second electrode on the passivation layer. Relative permittivity ($\epsilon$) of the gate insulating layer is more than about 15, and a thickness of the gate insulating layer is about 2000 angstroms.

12 Claims, 6 Drawing Sheets

(56) References Cited

U.S. PATENT DOCUMENTS

2013/0161631 A1* 6/2013 Lee .................. H01L 29/66765
257/71

FOREIGN PATENT DOCUMENTS

| KR | 10-0770262 B1 | 10/2007 |
| KR | 10-0973811 B1 | 7/2010 |
| KR | 10-1244584 B1 | 3/2013 |
| KR | 10-1255315 B1 | 4/2013 |

* cited by examiner

THIN FILM TRANSISTOR ARRAY PANEL

This application claims priority to Korean Patent Application No. 10-2013-0169354 filed on Dec. 31, 2013, and all the benefits accruing therefrom under 35 U.S.C. §119, the entire contents of which are incorporated herein by reference.

BACKGROUND (a) Field

The invention relates to a thin film transistor array panel.

(b) Description of the Related Art

Liquid crystal displays ("LCDs") are one of the most widely used flat panel displays. The LCDs display images by applying voltages to field-generating electrodes to generate an electric field in an LC layer that determines orientations of LC molecules therein, to adjust polarization of incident light.

The LCD has a merit in that light weight and thin formation thereof are easily obtained. However, the LCD has a drawback in that lateral visibility thereof is lower than front visibility, such that LC arrangements and driving methods of various types have been developed to solve the drawback. To realize a relatively wide viewing angle, a LCD including a pixel electrode and a reference electrode on one substrate has been spotlighted.

SUMMARY

In a process of forming a pixel electrode and a reference electrode on a same substrate of a liquid crystal display ("LCD"), a photomask is separately required to respectively form the two electrodes such that a manufacturing cost is increased and a manufacturing method is complicated.

Also, when a cross-sectional thickness of an insulating layer positioned between the two electrodes is relatively large, a driving voltage of the LCD must be relatively large to generate a desired electric field between the two electrodes such that efficiency of the LCD may be deteriorated.

Further, there remains a desire to increase the transmittance of the LCD.

One or more exemplary embodiment of the invention provides a thin film transistor array panel for a liquid crystal display in which transmittance is increased without an increase of a driving voltage of the liquid crystal display, while a pixel electrode and a reference electrode are on one substrate of the liquid crystal display without a complicated manufacturing process.

A thin film transistor array panel according to an exemplary embodiment of the invention includes: an insulation substrate including a pixel area; a gate line and a first electrode on the insulation substrate; a gate insulating layer on the gate line and the first electrode; a data line on the gate insulating layer; a passivation layer on the gate insulating layer and the data line; and a second electrode on the passivation layer. Relative permittivity ($\epsilon$) of the gate insulating layer is more than about 15, and a thickness of the gate insulating layer is about 2000 angstroms (Å).

The thickness of the gate insulating layer may be less than about 1800 Å.

Relative permittivity ($\epsilon$) of the passivation layer may be more than about 4.0, and a thickness of the passivation layer may be less than about 2000 Å.

The gate insulating layer may include hafnium oxide ($HfO_2$) or tantalum oxide ($Ta_2O_5$).

The passivation layer may include an organic material such as a polyimide and polymethylmethacrylate ("PMMA"), or an inorganic material such as a silicon oxide ($SiO_x$).

The first electrode may have a planar shape covering the entire pixel area, and the second electrode may include a plurality of branch electrodes.

A ratio W/S of a width W of the branch electrodes to an interval S between adjacent branch electrodes, and a total thickness T of the gate insulating layer and the passivation layer between the first electrode and the second electrode, may satisfy $-0.16T+0.38 \leq W/S \leq -0.16T+0.48$.

According to one or more exemplary embodiment of the thin film transistor array panel according to the invention, without a complicated manufacturing process, when disposing the pixel electrode and the reference electrode in one substrate of a liquid crystal display, the transmittance may be increased without an increase of the driving voltage of the liquid crystal display.

BRIEF DESCRIPTION OF THE DRAWINGS

The above and other features of this disclosure will become more apparent by describing in further detail exemplary embodiments thereof with reference to the accompanying drawings in which.

DETAILED DESCRIPTION

Figure 1:
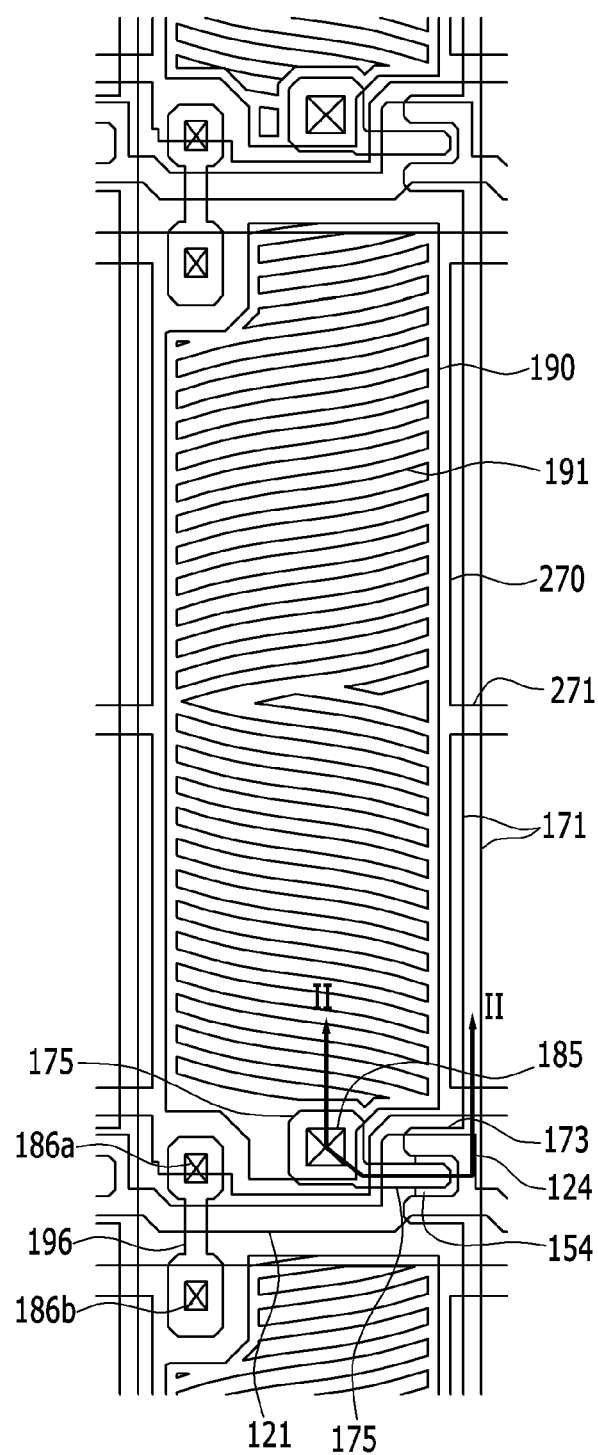
FIG. 1 is a plan view of an exemplary embodiment of a thin film transistor array panel according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

An exemplary embodiment of a thin film transistor array panel according to the invention will be described with reference to accompanying drawings.

Figure 2:
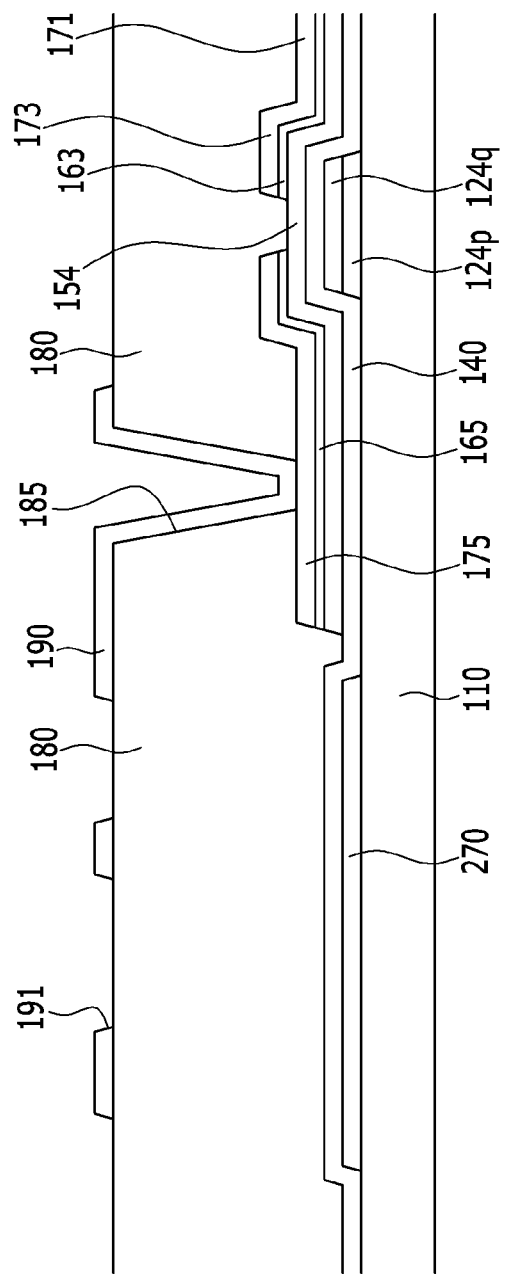
FIG. 2 is a cross-sectional view of the thin film transistor array panel of FIG. 1 taken along line II-II.

FIG. 1 is a plan view of an exemplary embodiment of a thin film transistor array panel according to the invention, and FIG. 2 is a cross-sectional view of the thin film transistor array panel of FIG. 1 taken along line II-II.

Referring to FIG. 1 and FIG. 2, a gate conductor including a gate line 121, and a common electrode 270 are disposed on an insulation substrate 110. The insulation substrate 110 may include a transparent glass or plastic. A pixel area may be defined in the insulation substrate 110.

The gate line 121 transmits gate signals and extends in a transverse (e.g., horizontal in FIG. 1) direction. The thin film transistor array panel may include a plurality of gate lines 121. Each of gate lines 121 includes a plurality of gate electrodes 124 such as protruding upward from a main portion of the gate line 121 in the plan view, and an end portion (not shown) for connection with another layer or an external driving circuit. A gate driving circuit (not shown) that generates a gate signal may be mounted on a flexible printed circuit film (not shown) that is attached to the insulation substrate 110, directly mounted on the insulation substrate 110 or integrated with the insulation substrate 110. When the gate driving circuit is integrated with the substrate 110, the gate line 121 is extended to directly connect to the gate driving circuit.

The gate conductor 121 and 124 has a dual-layer cross-sectional structure including a lower layer 124p and an upper layer 124q. The lower layer 124p of the gate conductor 121 and 124 is in the same layer as the reference electrode 270. The lower layer 124p of the gate conductor 121 and 124 includes a transparent conductive material such as poly-crystalline, mono-crystalline, or amorphous indium tin oxide ("ITO") or indium zinc oxide ("IZO"). The upper layer 124q of the gate conductor 121 and 124 may include a metal having relatively low resistivity to reduce a signal delay or a voltage drop in a display apparatus, such as a copper-based metal of copper (Cu) or copper alloys. However, the upper layer 124q of the gate conductor 121 and 124 may include an aluminum-based metal of aluminum (Al) or aluminum alloys, a silver-based metal of silver (Ag) or silver alloys, a molybdenum-based metal of molybdenum (Mo) or molybdenum alloys, chromium (Cr), tantalum (Ta) or titanium (Ti).

The common electrode 270 has a substantially plane shape covering the entire pixel area. The thin film transistor array panel may include a plurality of common electrodes 270 respectively disposed in a plurality of pixels. A common electrode connection 271 connects the common electrodes 270 disposed in neighboring pixel areas. The common electrode 270 includes a transparent conductive material such as poly-crystalline, mono-crystalline, or amorphous ITO or IZO.

In an exemplary embodiment of manufacturing the thin film transistor array panel, the gate conductor 121 and 124 and the common electrode 270 are simultaneously formed by using one exposure mask.

A gate insulating layer 140 including a silicon nitride (SiNx) or a silicon oxide (SiOx) is disposed on the gate conductor 121 and 124 and the common electrode 270.

Relative permittivity ($\epsilon$) of the gate insulating layer 140 is more than about 15, and a cross-sectional thickness of the gate insulating layer 140 is less than about 2000 angstroms (Å), such as about 1800 Å.

The gate insulating layer 140 includes hafnium oxide ($HfO_2$) or tantalum oxide ($Ta_2O_5$).

In general, the relative permittivity ($\epsilon$) of a gate insulating layer may be about 6.6, and the cross-sectional thickness thereof may be about 4000 Å.

However, in one or more exemplary embodiment of the thin film transistor array panel for a liquid crystal display according to the invention, as compared with the general gate insulating layer discussed above, the gate insulating layer 140 has the relatively large relative permittivity ($\epsilon$) such that the gate insulating layer 140 may have an insulating characteristic even though the cross-sectional thickness thereof is relatively thin. That is, by forming the gate insulating layer 140 from material having the relatively high relative permittivity, the cross-sectional thickness of the gate insulating layer 140 may be decreased while maintaining a voltage current characteristic of a thin film transistor of the thin film transistor array panel including the gate insulating layer 140.

Like this, by forming the gate insulating layer 140 to be relatively thin, a cross-sectional thickness of an insulating layer between the common (e.g., reference) electrode 270 positioned under the gate insulating layer 140 and an overlying pixel electrode 190 may be reduced.

A plurality of semiconductors 154 including hydrogenated amorphous silicon (a-Si) or polysilicon is disposed on the gate insulating layer 140.

A plurality of ohmic contacts 163 and 165 is disposed on the semiconductors 154. The ohmic contacts 163 and 165 may include a material such as n+ hydrogenated amorphous silicon in which an n-type impurity such as phosphorus is doped with a high concentration, or silicide. The ohmic contacts 163 and 165 are disposed to face to each other with respect to the semiconductor 154.

A plurality of data lines 171 and a plurality of drain electrodes 175 are disposed on the ohmic contacts 163 and 165.

The data lines 171 transmit data signals and mainly extend in the longitudinal (e.g., vertical in FIG. 1) direction thereby intersecting the gate lines 121.

Each data line 171 includes a plurality of source electrodes 173 that protrude from a main portion thereof and are extended toward the gate electrode 124, and a wide end (not shown) for connecting to other layers or an external driving circuit.

Each drain electrode 175 is separated from the data line 171 and faces the source electrode 173 with respect to the gate electrode 124.

The drain electrode 175 includes a bar-shaped first end portion and a wide second end extension portion having a relatively large planar area as compared to the bar-shaped first end portion. The bar-shaped first end portion is partially enclosed by the curved source electrode 173 in the plan view.

The gate electrode 124, the source electrode 173 and the drain electrode 175 form a thin film transistor ("TFT") along with the semiconductor 154. A channel of the TFT is formed in the semiconductor 154 exposed between the source electrode 173 and the drain electrode 175.

The data lines 171 and the drain electrodes 175 include a refractory metal, such as molybdenum, chromium, tantalum and titanium, or their alloys. The data lines 171 and the drain electrodes 175 can have a multilayer cross-sectional structure including a refractory metal film (not shown) and a low-resistance conductive layer (not shown). Examples of the multilayer structure can include a dual layer of a chromium or molybdenum (alloy) lower film and an aluminum (alloy) upper film, and a triple layer of a molybdenum (alloy) lower film, an aluminum (alloy) intermediate layer and a molybdenum (alloy) upper film. Also, the data lines 171 and the drain electrodes 175 can include various other metals or conductors.

The ohmic contact 163 and 165 exist only between the underlying semiconductor 154, and the overlying data lines 171 and drain electrodes 175, to lower contact resistance therebetween.

A passivation layer 180 is disposed on the data lines 171, the drain electrodes 175 and the exposed portions of the semiconductor 154.

The relative permittivity ($\epsilon$) of the passivation layer 180 may be more than about 4.0, and the cross-sectional thickness of the passivation layer 180 may be less than about 2000 Å.

The passivation layer 180 may include an organic material such as a polyimide and polymethylmethacrylate ("PMMA"), or an inorganic material such as silicon oxide ($SiO_x$).

In general, the relative permittivity ($\epsilon$) of a passivation layer is about 6.6, and the cross-sectional thickness thereof is about 4000 Å.

However, in one or more exemplary embodiment of the thin film transistor array panel for the liquid crystal display according to the invention, as compared with the general passivation layer discussed above, the passivation layer 180 has the relatively large relative permittivity ($\epsilon$), and even though the cross-sectional thickness is relatively thin, the passivation layer 180 may reduce or effectively prevent coupling between the data line 171 and the pixel electrode 190.

Like this, since the passivation layer 180 is relatively thin, the cross-sectional thickness of the insulating layer between the common electrode 270 positioned under the passivation layer 180 and the overlying pixel electrode 190 may be reduced.

A surface of the passivation layer 180 may be flat to planarize the underlying layers of the thin film transistor array panel.

A first contact hole 185a is defined in the passivation layer 180 and exposes the drain electrode 175. A plurality of second contact holes 186a and a plurality of third contact holes 186b are defined in the passivation layer 180 and the gate insulating layer 140 and respectively expose portion of the common electrode 270 disposed at two pixel areas adjacent to each other in a pixel column direction (e.g., vertical in FIG. 1).

A plurality of pixel electrodes 190 and a plurality of first contact assistants 196 are disposed on the passivation layer 180. The plurality of pixel electrodes 190 and the plurality of first contact assistants 196 may include a transparent conductive material such as mono-crystalline, poly-crystalline, or amorphous ITO or IZO, or a reflective metal such as aluminum, silver, chromium, or alloys thereof.

The first contact assistants 196 connect the common electrodes 270 to each other that are exposed through the second contact hole 186a and the third contact hole 186b of adjacent pixels in the pixel column direction.

The pixel electrode 190 includes a plurality of branch electrodes 191. The branch electrodes 191 of the pixel electrode 190 extend in a direction approximately parallel to the gate line 121, and may be inclined with an angle of about 5 degrees (°) to about 20° with the gate line 121. The branch electrodes 191 are elongated in an extension direction, and a width W of a branch electrode 191 is taken perpendicular to the extension direction thereof. An interval S between adjacent branch electrodes 191 may also be taken perpendicular to extension directions thereof.

A ratio W/S of a width W of the plurality of first branch electrodes 191 of the pixel electrode 190 to an interval S between two adjacent first branch electrodes 191, and a total cross-sectional thickness T of the gate insulating layer 140 and the passivation layer 180 as the collective insulating layer positioned between the common electrode 270 and the pixel electrode 190, is satisfied by an Equation 1 below.

$$-0.16T+0.38 \leq W/S \leq -0.16T+0.48 \quad \text{Equation 1}$$

Also, the width W of a plurality of first branch electrodes 191 of the pixel electrode 190 may be about 2.6 micrometers (μm) to about 4.8 μm, such as about 3.2 μm, and the interval S between two adjacent first branch electrodes 191 may be about 3.2 μm to about 5.4 μm, such as about 4.8 μm.

Like this, by satisfying the above Equation 1 for the ratio W/S of a width W of a plurality of first branch electrodes 191 of the pixel electrode 190 to an interval S between two adjacent first branch electrodes 191, and the total thickness T of the gate insulating layer 140 and the passivation layer 180, the transmittance of the liquid crystal display may be increased.

Each pixel electrode 190 is physically and electrically connected with the drain electrode 175 through the first contact hole 185, and receives a data voltage from the drain electrode 175. The pixel electrode 190 applied with the data voltages generates an electric field along with the common electrode 270 that receives a reference voltage, to thereby determine a direction of the liquid crystal molecules (not shown) of a liquid crystal layer between the two electrodes 190 and 270. Polarization of light that transmits through the liquid crystal layer can be varied according to the determined direction of the liquid crystal molecules.

In one or more exemplary embodiment of the invention, the lower layer of the gate conductor, and the reference electrode are in the same layer of the thin film transistor array panel, and the gate conductor and the reference electrode are simultaneously formed such that the manufacturing process of the thin film transistor array panel may be simplified.

Also, while maintaining the characteristics of the gate insulating layer and the passivation layer as the insulating layer between the reference electrode and the pixel electrode, by reducing the thickness thereof, increase of the driving voltage of the liquid crystal display may be reduced or effectively prevented by using the insulating layer having the relatively thin thickness. Accordingly, efficiency of the liquid crystal display may be increased.

Also, by satisfying the above Equation 1 for the ratio W/S of a width W of a plurality of first branch electrodes 191 of the pixel electrode 190 to an interval S between two adjacent first branch electrodes 191, and the total thickness T of the gate insulating layer 140 and the passivation layer 180, the transmittance of the liquid crystal display may be increased.

Also, by the width W of a plurality of first branch electrodes 191 of the pixel electrode 190 being relatively larger, an overlapping area between the common electrode 270 and the pixel electrode 190 is large such that storage capacitance of a storage capacitor of the liquid crystal display may be largely maintained.

Figure 3:
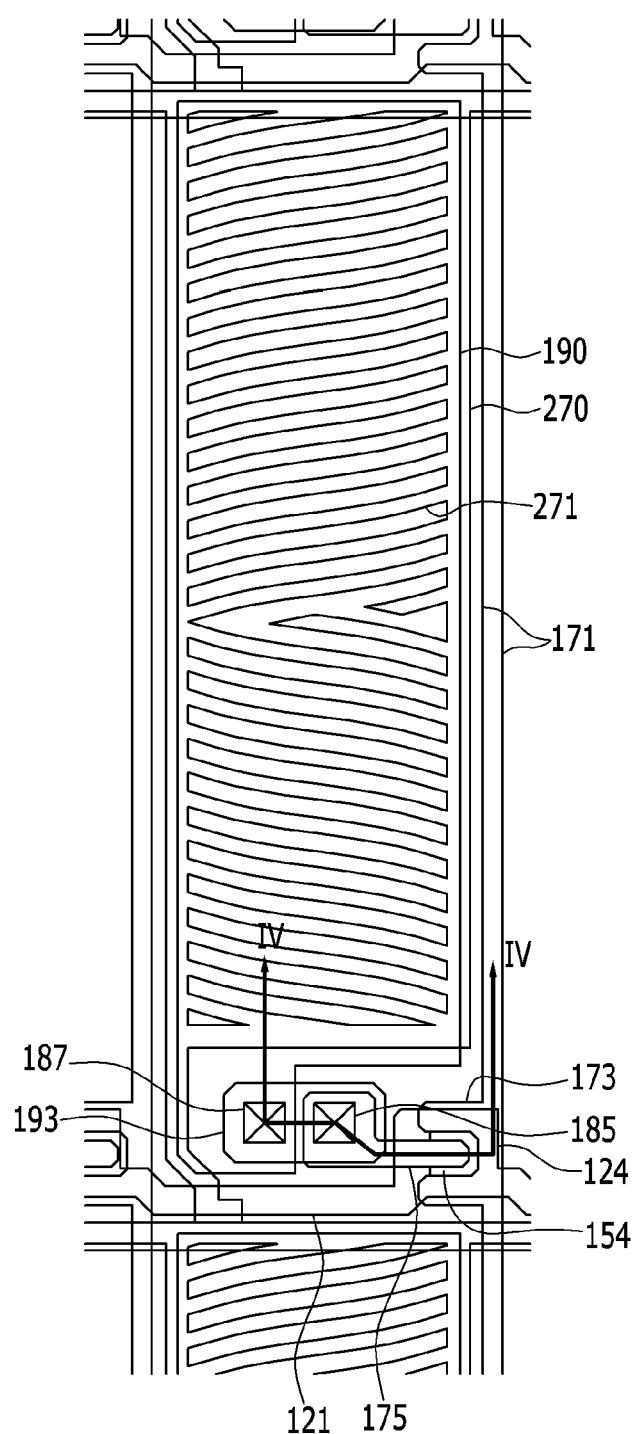
FIG. 3 is a plan view of another exemplary embodiment of a thin film transistor array panel according to the invention.

Next, another exemplary embodiment of a thin film transistor array panel according to the invention will be described with reference to FIG. 3 and FIG. 4. FIG. 3 is a plan view of an another exemplary embodiment of a thin film transistor array panel according to the invention, and FIG. 4 is a cross-sectional view of the thin film transistor array panel of FIG. 3 taken along line IV-IV.

Figure 4:
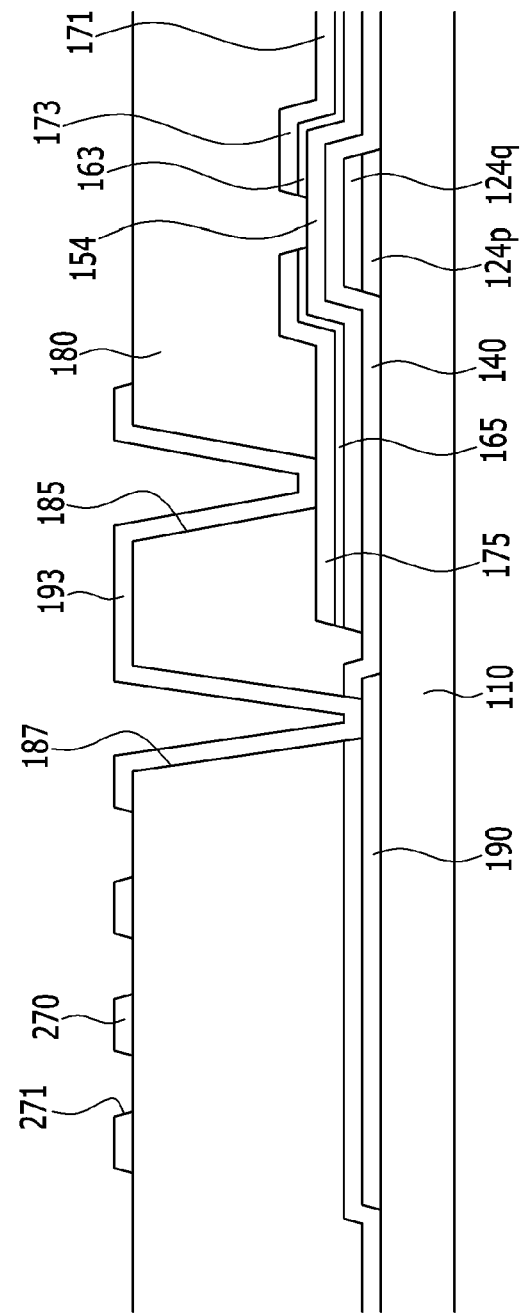
FIG. 4 is a cross-sectional view of the thin film transistor array panel of FIG. 3 taken along line IV-IV.

Referring to FIG. 3 and FIG. 4, a layer structure of the thin film transistor array panel is similar to the layer structure of the thin film transistor array panel according to the exemplary embodiment shown in FIG. 1 and FIG. 2.

Referring to the thin film transistor array panel in FIG. 3 and FIG. 4, a gate conductor including a gate line 121, and a pixel electrode 190 are disposed on an insulation substrate 110. The insulation substrate 100 may include transparent glass or plastic.

The pixel electrode 190 has the planar shape covering the entire pixel area.

The gate conductor 121 and 124 is a dual-layer structure including a lower layer 124*p* and an upper layer 124*q*. The lower layer 124*p* of the gate conductor 121 and 124 is in the same layer as the pixel electrode 190. The lower layer 124*p* of the gate conductor 121 and 124 includes the transparent conductive material such as poly-crystalline, mono-crystalline, or amorphous ITO or IZO. The upper layer 124*q* of the gate conductor 121 and 124 may include a metal having relatively low resistivity to reduce a signal delay or a voltage drop in a display apparatus, such as a copper-based metal of copper (Cu) or copper alloys. However, the upper layer 124*q* of the gate conductor 121 and 124 may include an aluminum-based metal of aluminum (Al) or aluminum alloys, a silver-based metal of silver (Ag) or silver alloys, a molybdenum-based metal of molybdenum (Mo) or molybdenum alloys, chromium (Cr), tantalum (Ta), or titanium (Ti).

In an exemplary embodiment of manufacturing the thin film transistor array panel, the gate conductor 121 and 124 and the pixel electrode 190 are simultaneously formed by using one exposure mask.

A gate insulating layer 140 including a silicon nitride (SiNx) or a silicon oxide (SiOx) is disposed on the gate conductor 121 and 124 and the pixel electrode 190.

The relative permittivity (ε) of the gate insulating layer 140 is more than about 15, and the cross-sectional thickness of the gate insulating layer 140 is less than about 2000 Å, such as about 1800 Å.

The gate insulating layer 140 includes hafnium oxide ($HfO_2$) or tantalum oxide ($Ta_2O_5$).

In general, the relative permittivity (ε) of a gate insulating layer is about 6.6, and the cross-sectional thickness thereof is about 4000 Å.

However, in one or more exemplary embodiment of the thin film transistor array panel for the liquid crystal display according to the invention, as compared with the general gate insulating layer discussed above, the gate insulating layer 140 has the relatively large relative permittivity (ε) such that the gate insulating layer 140 may have an insulating characteristic even though the thickness thereof is relatively thin.

Like this, by forming the gate insulating layer 140 to be relatively thin, a cross-sectional thickness of an insulating layer between the pixel electrode 190 positioned under the gate insulating layer 140 and an overlying common electrode 270 may be reduced.

A plurality of semiconductors 154 including hydrogenated amorphous silicon (a-Si) or polysilicon is disposed on the gate insulating layer 140.

A plurality of ohmic contacts 163 and 165 is disposed on the semiconductor 154.

A plurality of data lines 171 and a plurality of drain electrodes 175 are disposed on the ohmic contacts 163 and 165.

The data lines 171 transmit the data signals and mainly extend in the longitudinal direction thereby intersecting the gate lines 121.

Each data line 171 includes a plurality of source electrodes 173 that protrude from a main portion thereof and are extended toward the gate electrode 124, and a wide end (not shown) for connecting to other layers or an external driving circuit.

Each drain electrode 175 is separated from the data line 171 and faces the source electrode 173 with respect to the gate electrode 124.

The drain electrode 175 includes a bar-shaped first end portion and a wide second end extension portion having a relatively large planar area. The bar-shaped first end portion is partially enclosed by the curved source electrode 173 in the plan view.

A passivation layer 180 is disposed on the data lines 171, the drain electrodes 175, and the exposed portions of the semiconductor 154.

The relative permittivity ($\epsilon$) of the passivation layer 180 may be more than about 4.0, and the cross-sectional thickness of the passivation layer 180 may be less than about 2000 Å.

The passivation layer 180 may include an organic material such as a polyimide and PMMA, or an inorganic material such as a silicon oxide ($SiO_x$).

In general, the relative permittivity ($\epsilon$) of a passivation layer is about 6.6, and the cross-sectional thickness thereof is about 4000 Å.

However, in one or more exemplary embodiment of the thin film transistor array panel for the liquid crystal display according to the invention, as compared with the general passivation layer discussed above, the passivation layer 180 has the relatively large relative permittivity ($\epsilon$), and even though the cross-sectional thickness is relatively thin, the passivation layer 180 may reduce or effectively prevent coupling between the data line 171 and the common electrode 270.

Like this, since the passivation layer 180 is relatively thin, the cross-sectional thickness of the insulating layer between the pixel electrode 190 positioned under the passivation layer 180 and the overlying common electrode 270 may be reduced.

A first contact hole 185 is defined in the passivation layer 180 and exposes the drain electrode 175. A fourth contact hole 187 is defined in the gate insulating layer 140 and the passivation layer 180 and exposes the pixel electrode 190.

A plurality of common electrodes 270 and a plurality of second contact assistants 193 are disposed on the passivation layer 180. A common electrode 270 includes a plurality of second branch electrodes 271. The second branch electrodes 271 may extend in a direction approximately parallel to the gate line 121, and may be inclined with an angle of about 5° to about 20° with the gate line 121. The branch electrodes 271 are elongated in an extension direction, and a width W of a branch electrode 271 is taken perpendicular to the extension direction thereof. An interval S between adjacent branch electrodes 271 may also be taken perpendicular to extension directions thereof.

A ratio W/S of a width W of a plurality of second branch electrodes 271 of the common electrode 270 to an interval S between two adjacent second branch electrodes 271, and a total thickness T of the gate insulating layer 140 and the passivation layer 180 as the collective insulating layer positioned between the common electrode 270 and the pixel electrode 190, is satisfied by Equation 1 below.

$$-0.16T+0.38 \leq W/S \leq 0.16T+0.48 \qquad \text{Equation 1}$$

Also, the width W of a plurality of second branch electrodes 271 of the common electrode 270 may be about 2.6 μm to about 4.8 μm, such as about 3.2 μm, and the interval S between two adjacent second branch electrodes 271 may be about 3.2 μm to about 5.4 μm, such as about 4.8 μm.

Like this, by satisfying the above Equation 1 for the ratio W/S of a width W of a plurality of second branch electrodes 271 of the common electrode 270 to an interval S between two adjacent second branch electrodes 271, and the total thickness T of the gate insulating layer 140 and the passivation layer 180, the transmittance of the liquid crystal display may be increased.

The second contact assistant 193 connects the drain electrode 175 exposed through the first contact hole 185 and the pixel electrode 190 exposed through the fourth contact hole 187, to each other.

Like this, different from the thin film transistor array panel shown in FIG. 1 and FIG. 2, in the thin film transistor array panel shown in FIG. 3 and FIG. 4, the pixel electrode 190 is in the same layer as the lower layer of the gate conductor 121 and 124 and in an exemplary embodiment of manufacturing the thin film transistor array panel, is simultaneously formed with the gate conductor (21 and 124. Further, in the thin film transistor array panel shown in FIG. 3 and FIG. 4, the common electrode 270 having a plurality of second branch electrodes 271 defined therein is disposed on the passivation layer 180. The remaining structure of the thin film transistor panel shown in FIG. 3 and FIG. 4 is substantially the same as the thin film transistor array panel according to the exemplary embodiment shown in FIG. 1 and FIG. 2.

In one or more exemplary embodiment of the thin film transistor array panel according to the invention, the lower layer of the gate conductor, and the pixel electrode are in the same layer, and the gate conductor and the pixel electrode are simultaneously formed, thereby simplifying the manufacturing process of the thin film transistor array panel.

By increasing the relative permittivity of the gate insulating layer and the passivation layer as the collective insulating layer positioned between the pixel electrode and the reference electrode, reducing the thickness of thereof, and using the collective insulating layer having the relatively thin thickness, increasing of the driving voltage of the liquid crystal display may be reduced or effectively prevented. Accordingly, the efficiency of the liquid crystal display may be increased.

Also, by satisfying the above Equation 1 for the ratio W/S of a width W of a plurality of second branch electrodes 271 of the common electrode 270 to an interval S between two adjacent second branch electrodes 271, and the total thickness T of the gate insulating layer 140 and the passivation layer 180, the transmittance of the liquid crystal display may be increased.

Further, by the width of a plurality of second branch electrodes 271 of the common electrode 270 being relatively larger, the overlapping area between the common electrode 270 and the pixel electrode 190 is widened such that the storage capacitance of the storage capacitor of the liquid crystal display may be largely maintained.

Figure 5:
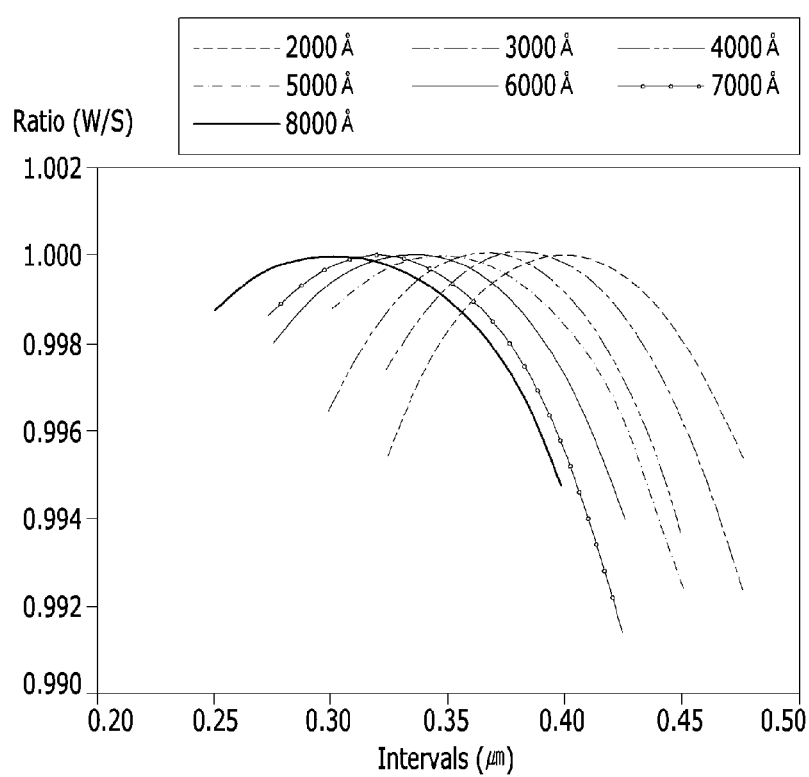
FIG. 5 and FIG. 6 are graphs showing results of an experimental example according to the invention.
Figure 6:
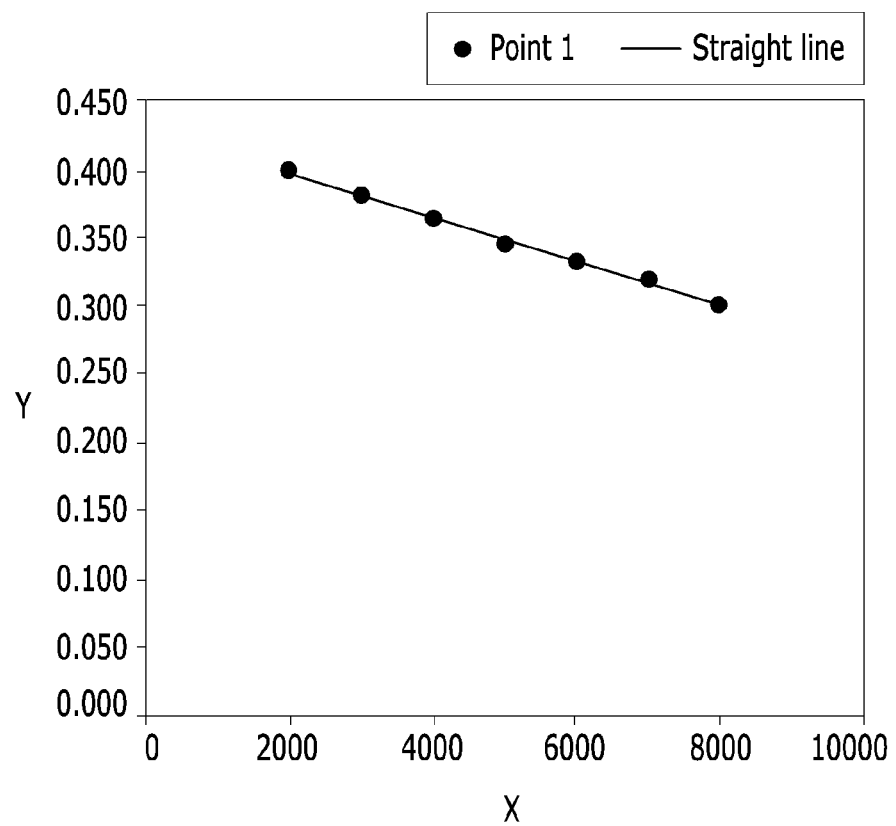

Next, an experimental example of the invention will be described with reference to FIG. 5 and FIG. 6. FIG. 5 and FIG. 6 are graphs showing results of an experimental example of the invention.

In the experimental example, among two electrodes overlapping each other via the insulating layer therebetween, in detail, the pixel electrode and the reference electrode overlapping each other via the gate insulating layer and the passivation layer, while changing the ratio W/S of the width W of the branch electrodes of the electrode having a plurality of branch electrodes to the interval S between two adjacent branch electrode, and the total thickness T of the collective insulating layer positioned between the two electrodes overlapping each other, transmittance is measured and result thereof are shown in FIG. 5. Also, among the pixel electrode and the reference electrode having a highest transmittance, the ratio W/S of the width W of the branch electrodes of the electrode having a plurality of branch electrodes to the interval S between two adjacent branch electrode, and the total thickness T of the collective insulating layer positioned between two electrodes, are shown in FIG. 6.

Referring to FIG. 5, it may be confirmed that the transmittance of the liquid crystal display is largely changed according to the ratio W/S of the width W of the branch electrodes of the electrode having a plurality of branch electrodes to the interval S (in μm) between two adjacent branch electrode, and the total thickness T (in Å) of the collective insulating layer positioned between two electrodes among the pixel electrode and the reference electrode overlapping each other via the gate insulating layer and the passivation layer.

Referring to FIG. 6, a straight line connecting points representing the ratio W/S of the width W of the branch electrodes of the electrode having a plurality of branch electrodes the interval S between two adjacent branch electrode, and the total thickness T of the collective insulating layer positioned between two electrodes among the pixel electrode and the reference electrode having a highest transmittance, satisfies Y=−0.16X+0.429223 between an X-axis representing the total thickness T in Å of the collective insulating layer and a Y-axis representing the ratio W/S.

In this way, in one or more exemplary embodiment of the thin film transistor array panel for the liquid crystal display according to the invention, when satisfying the Equation 1 between the ratio W/S of the width W of the branch electrodes of the electrode having a plurality of branch electrodes to the interval S between two adjacent branch electrode, and the total thickness T of the collective insulating layer positioned between two electrodes among the pixel electrode and the reference electrode, it may be confirmed that the transmittance of the liquid crystal display is a maximum.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
   an insulation substrate comprising a pixel area;
   a gate line and a first electrode on the insulation substrate;
   a second electrode which forms an electric field with the first electrode;
   a gate insulating layer between the second electrode and the first electrode which form the electric field;
   a data line on the gate insulating layer; and
   a passivation layer on the gate insulating layer and the data line, and between the gate insulating layer and the second electrode which forms the electric field with the first electrode, wherein
   the first electrode has a planar shape covering the entire pixel area,
   the second electrode comprises a plurality of branch electrodes spaced apart from each other, and
   a ratio W/S of a width W of the branch electrodes to an interval S between adjacent branch electrodes, and a total thickness T defined by a sum of thicknesses of the gate insulating layer and the passivation layer between the first electrode and the second electrode which form the electric field, satisfy Equation 1:

$$0.16T+0.38 < W/S < -0.16T +0.48 \quad \text{Equation 1.}$$

2. The thin film transistor array panel of claim 1, wherein relative permittivity ($\epsilon$) of the gate insulating is more than about 15, and
a thickness of the gate insulating layer is less than about 2000 angstroms.

3. The thin film transistor array panel of claim 2, wherein relative permittivity ($\epsilon$) of the passivation layer is more than about 4.0, and a thickness of the passivation layer is less than about 2000 angstroms.

4. The thin film transistor array panel of claim 3, wherein the gate insulating layer comprises hafnium oxide or tantalum oxide.

5. The thin film transistor array panel of claim 4, wherein the passivation layer comprises:
   an organic material comprising a polyimide or polymethylmethacrylate, or
   an inorganic material comprising silicon oxide.

6. The thin film transistor array panel of claim 2, wherein the thickness of the gate insulating layer is less than about 1800 angstroms.

7. The thin film transistor array panel of claim 1, wherein relative permittivity ($\epsilon$) of the passivation layer is more than about 4.0, and a thickness of the passivation layer is less than about 2000 angstroms.

8. The thin film transistor array panel of claim 7, wherein the gate insulating layer comprises hafnium oxide or tantalum oxide.

9. The thin film transistor array panel of claim 8, wherein the passivation layer comprises:
   an organic material comprising a polyimide or polymethylmethacrylate, or
   an inorganic material comprising silicon oxide.

10. The thin film transistor array panel of claim 1, wherein the gate insulating layer comprises hafnium oxide or tantalum oxide.

11. The thin film transistor array panel of claim 10, wherein the passivation layer comprises:
   an organic material comprising a polyimide or polymethylmethacrylate, or
   an inorganic material comprising silicon oxide.

12. The thin film transistor array panel of claim 1, wherein the gate line and the first electrode which forms the electric field with the second electrode, are in a same layer.

* * * * *